(12) United States Patent
Ishii et al.

(10) Patent No.: US 7,787,718 B2
(45) Date of Patent: Aug. 31, 2010

(54) SUSPENSION BOARD WITH CIRCUIT

(75) Inventors: Jun Ishii, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/453,506

(22) Filed: May 13, 2009

(65) Prior Publication Data

US 2009/0285524 A1 Nov. 19, 2009

Related U.S. Application Data

(60) Provisional application No. 61/071,914, filed on May 23, 2008.

(30) Foreign Application Priority Data

May 14, 2008 (JP) ............................. 2008-127235

(51) Int. Cl.
G02B 6/12 (2006.01)
G02B 6/26 (2006.01)
G02B 6/30 (2006.01)
G02B 6/36 (2006.01)
G02B 6/10 (2006.01)
G02B 6/00 (2006.01)

(52) U.S. Cl. ............................. 385/14; 385/15; 385/31; 385/39; 385/49; 385/52; 385/53; 385/88; 385/89; 385/92; 385/129; 385/130; 385/131; 385/132; 385/141; 385/147

(58) Field of Classification Search .................... 385/14, 385/15, 31, 39, 49, 52, 53, 88, 89, 92, 129–132, 385/141, 147
See application file for complete search history.

(56) References Cited

U.S. PATENT DOCUMENTS

2003/0059151 A1 * 3/2003 Brist et al. ..................... 385/14
2006/0187564 A1 8/2006 Sato et al.
2008/0115962 A1 * 5/2008 Juni et al. .................... 174/250

FOREIGN PATENT DOCUMENTS

JP 2006-185548 7/2006

* cited by examiner

*Primary Examiner*—Charlie Peng
*Assistant Examiner*—Hung Lam
(74) *Attorney, Agent, or Firm*—Jean C. Edwards, Esq.; Akerman Senterfitt (57) ABSTRACT

A suspension board with circuit includes a metal supporting board including a board trench portion, an insulating base layer formed on a surface of the metal supporting board, a conductive pattern formed on a surface of the insulating base layer, and an optical waveguide provided to overlap the board trench portion when projected in a thickness direction of the metal supporting board. At least a part of the optical waveguide is positioned closer to the conductive pattern than to a back surface of the metal supporting board.

5 Claims, 7 Drawing Sheets

SUSPENSION BOARD WITH CIRCUIT

CROSS-REFERENCE TO RELATED APPLICATION

The present application claims priority from U.S. Patent Provisional Application No. 61/071,914 filed on May 23, 2008, and also claims priority from Japanese Patent Application No. 2008-127235 filed on May 14, 2008, the content of each of which is hereby incorporated by reference into this application.

BACKGROUND OF THE INVENTION

1. Field of the Invention

The present invention relates to a suspension board with circuit and, more particularly, to a suspension board with circuit mounted in a hard disk drive or the like in which a thermally assisted method is used.

2. Description of the Related Art

As a method of magnetic recording to a hard disk or the like, a thermally assisted method (thermally assisted magnetic recording method) has been known in recent years. According to the thermally assisted method, when information is to be recorded, a hard disk is heated with light radiation to have a reduced coersive force. Then, using a magnetic head, recording is performed to the hard disk having the reduced coersive force to enable high-density recording of the information with a small recording magnetic field.

For example, for a thermally assisted magnetic recording head which uses the thermally assisted method, it has been proposed that a floating slider and a recording magnetic pole are disposed on one longitudinal side of a suspension, a laser diode is disposed on the other longitudinal side thereof, and an optical waveguide for guiding light from the laser diode to the recording magnetic pole is disposed on the suspension to extend along a direction from one side toward the other side (see, e.g., Japanese Unexamined Patent No. 2006-185548 (FIG. 9)). Such a suspension is typically mounted on the block E of a hard disk drive.

SUMMARY OF THE INVENTION

However, in the suspension described in Japanese Unexamined Patent No. 2006-185548, the optical waveguide is provided on the suspension, and therefore protrudes from the suspension. As a result, when the suspension is mounted on the E block, the optical waveguide interrupts insertion of the suspension into the E block. During the mounting of the suspension, a problem also occurs that the optical waveguide is brought into contact with the E block, and damaged thereby.

It is therefore an object of the present invention to provide a suspension board with circuit which allows smooth insertion of a suspension into an E block and a reduction in damage to an optical waveguide, while allowing the use of a thermally assisted method.

A suspension board with circuit of the present invention includes a metal supporting board including a board trench portion, an insulating base layer formed on a surface of the metal supporting board, a conductive pattern formed on a surface of the insulating base layer, and an optical waveguide provided to overlap the board trench portion when projected in a thickness direction of the metal supporting board, wherein at least a part of the optical waveguide is positioned closer to the conductive pattern than to a back surface of the metal supporting board.

In the suspension board with circuit, at least the part of the optical waveguide is disposed at a position overlapping the board trench portion, and closer to the conductive pattern than to the back surface of the metal supporting board when projected in the thickness direction of the metal supporting board. This allows a reduction in the protrusion of the optical waveguide from the back surface of the suspension board with circuit. As a result, it is possible to reduce the degree to which insertion of the suspension board with circuit into a block E is interrupted by the optical waveguide, and reduce damage received by the optical waveguide from the block E.

In the suspension board with circuit of the present invention, it is preferable that the optical waveguide is contained in the board trench portion.

Since the optical waveguide is contained in the board trench portion, the optical waveguide does not protrude from the back surface of the suspension board with circuit. As a result, it is possible to further reduce the degree to which insertion of the suspension board with circuit into the block E is interrupted by the optical waveguide, and further reduce the damage received by the optical waveguide from the block E.

In the suspension board with circuit of the present invention, it is preferable that a base trench portion is provided in the insulating base layer so as to overlap the board trench portion when projected in the thickness direction of the metal supporting board, and the optical waveguide is contained in the base trench portion.

When the optical waveguide is contained in the base trench portion, the optical waveguide can be disposed at a position inner than the metal supporting board. As a result, it is possible to further reduce the degree to which insertion of the suspension board with circuit into the block E is interrupted by the optical waveguide, and further reduce the damage received by the optical waveguide from the block E.

In the suspension board with circuit of the present invention, it is preferable that a supporting plate is provided on a lower surface of the optical waveguide, at least a part of the optical waveguide is contained in the base trench portion, and at least a part of the supporting plate is fitted in the board trench portion.

When the optical waveguide is contained in the base trench portion and the supporting plate is fitted in the board trench portion, it is possible to ensure reliable positioning of the optical waveguide with respect to the suspension board with circuit. This allows an improvement in the transmission efficiency of the optical waveguide.

DETAILED DESCRIPTION OF THE INVENTION

Figure 1:
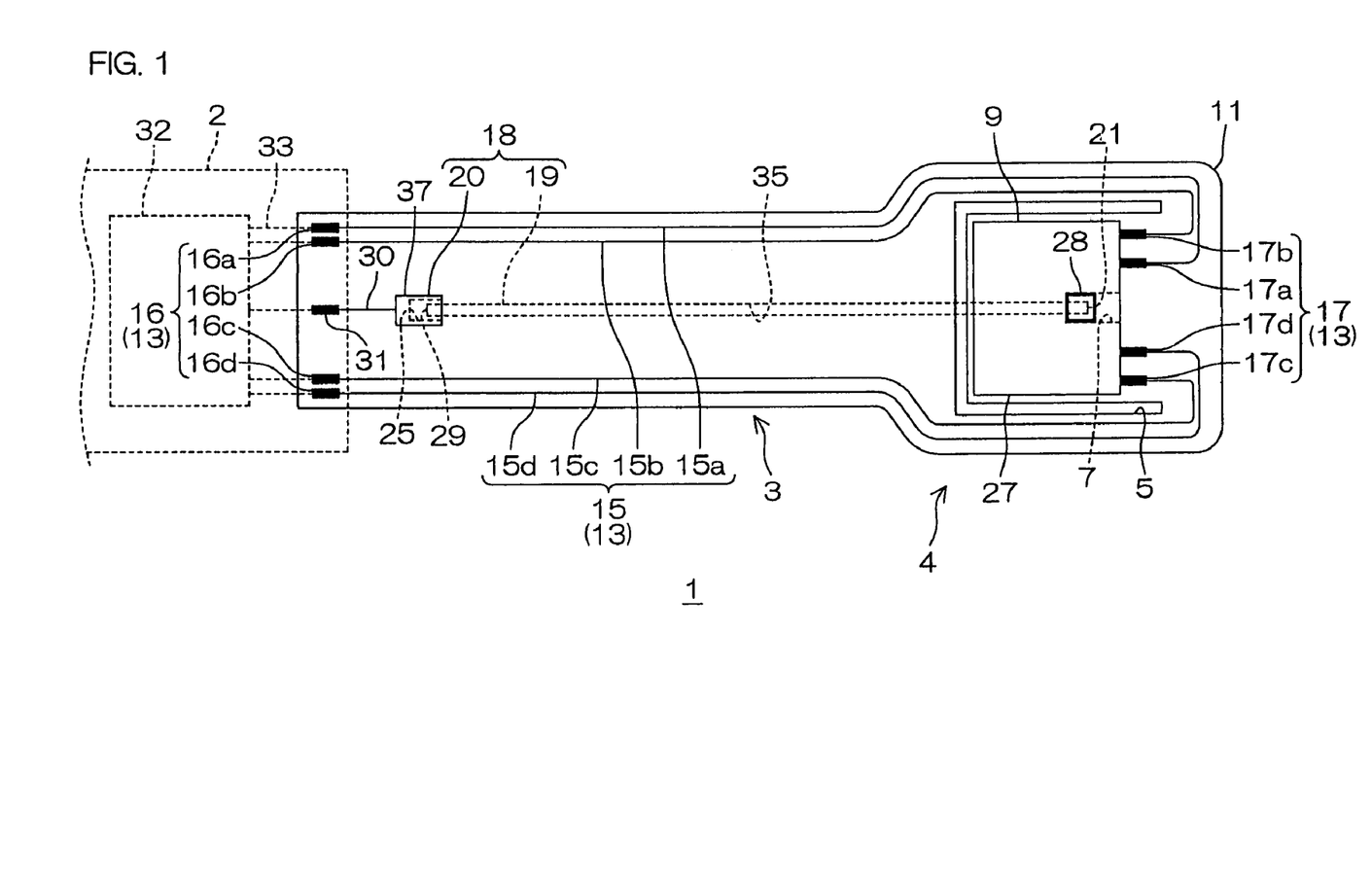
FIG. 1 is a plan view showing an embodiment of a suspension board with circuit of the present invention.
Figure 2:
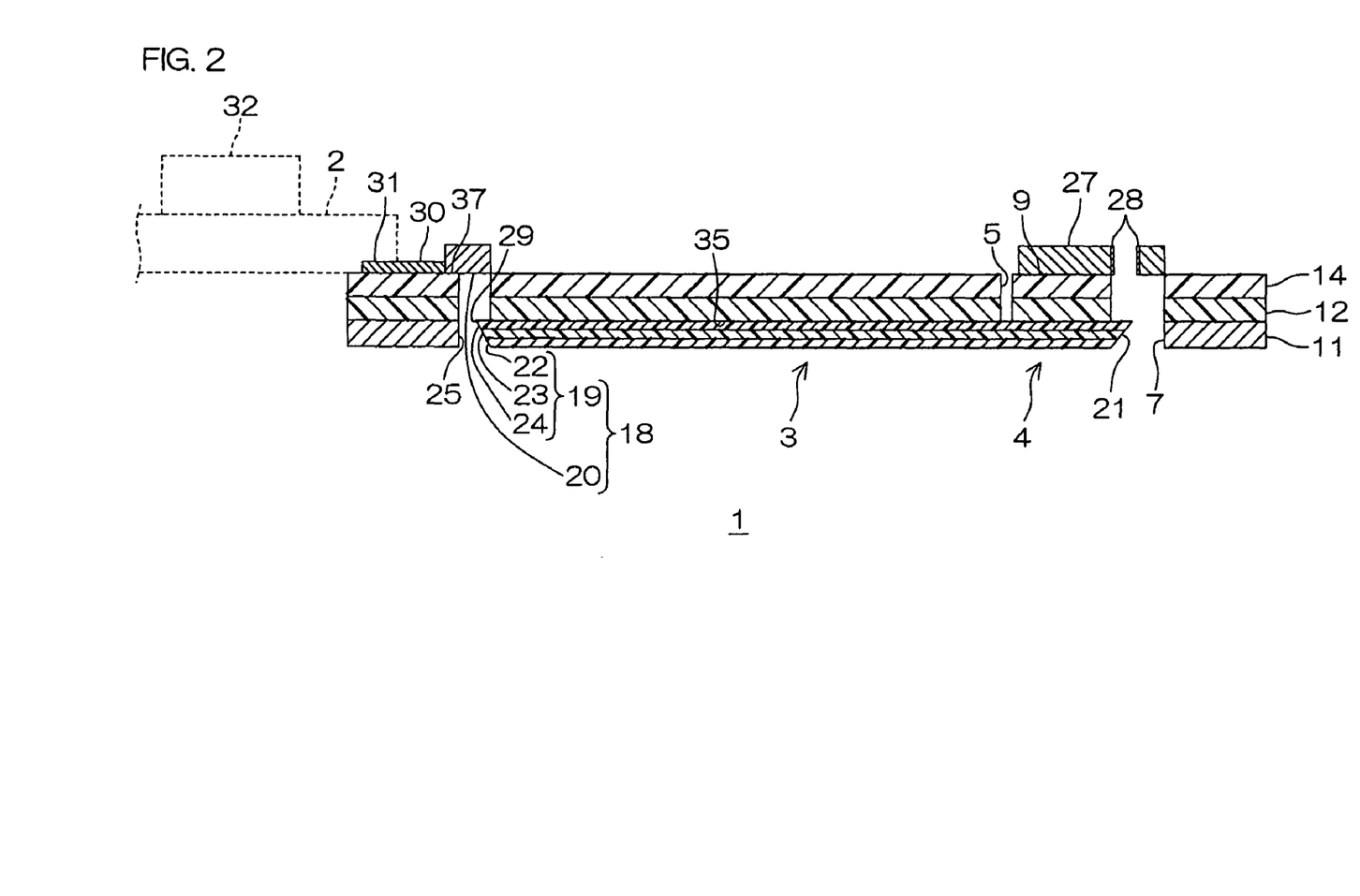
FIG. 2 is a cross-sectional view of the suspension board with circuit shown in FIG. 1 along an optical waveguide.
Figure 3:
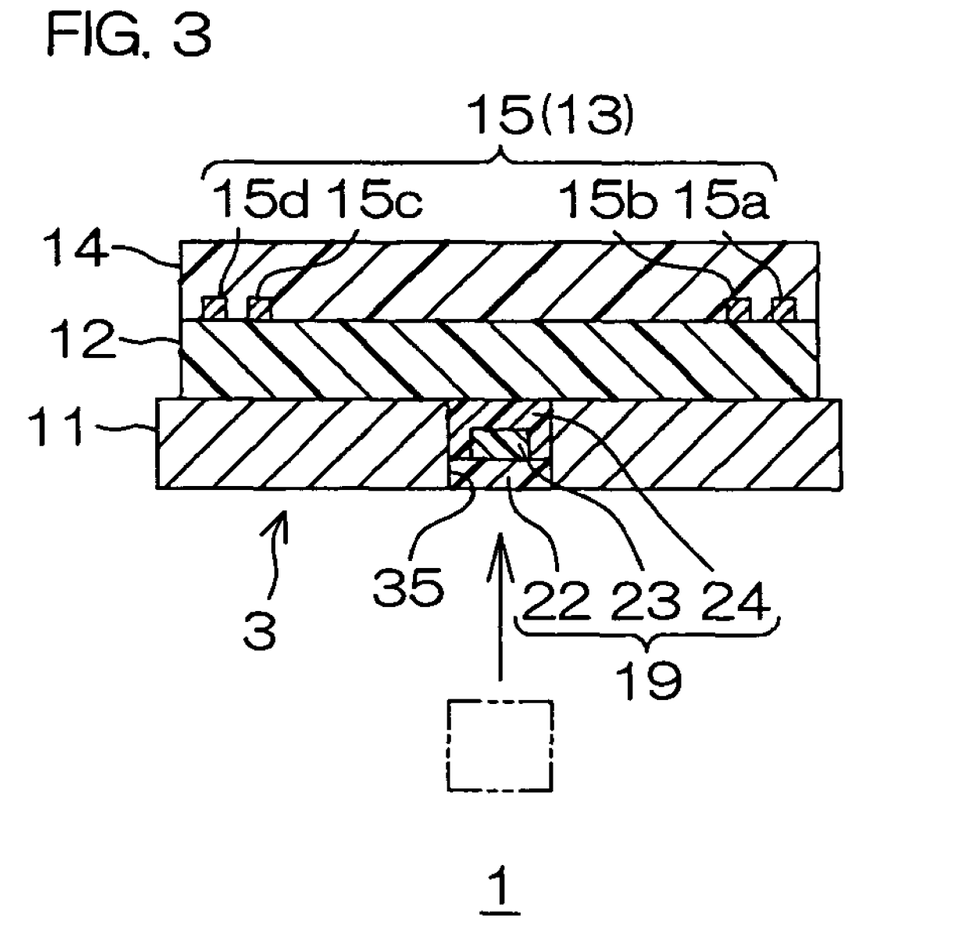
FIG. 3 is a cross-sectional view (a configuration in which the optical waveguide is contained in a board trench portion) of the wiring portion of the suspension board with circuit shown in FIG. 1 along a widthwise direction.

FIG. 1 is a plan view showing an embodiment of a suspension board with circuit of the present invention. FIG. 2 is a cross-sectional view of the suspension board with circuit shown in FIG. 1 along an optical waveguide. FIG. 3 is a cross-sectional view (a configuration in which the optical waveguide is contained in a board trench portion) of the wiring portion of the suspension board with circuit shown in FIG. 1 along a direction (hereinafter referred to as a widthwise direction) perpendicular to the longitudinal direction of the suspension board with circuit. In FIG. 1, an insulating base layer 12 and an insulating cover layer 14 are omitted.

In FIG. 1, the suspension boards with circuit 1 includes a metal supporting board 11 for mounting a magnetic head 28 (see FIG. 4) in a hard disk drive thereon to support the magnetic head 28, while holding a minute gap between the magnetic head 28 and a hard disk 26 (see FIG. 4), against an air flow when the magnetic head 28 and the hard disk 26 travel relatively to each other. On the metal supporting board 11, a conductive pattern 13 is integrally formed for connecting an external circuit board (such as, e.g., a read/write board) 2 and the magnetic head 28.

The suspension board with circuit 1 is formed in a flat belt shape extending in the longitudinal direction, and integrally includes a wiring portion 3 disposed on one longitudinal side (hereinafter referred to as a rear side), and a gimbal portion 4 disposed on the other longitudinal side (hereinafter referred to as a front side) opposite to the wiring portion 3.

The gimbal portion 4 is formed continuously from the front end of the wiring portion 3 into a generally rectangular shape which protrudes on both widthwise outsides of the wiring portion 3 when viewed in plan view. The gimbal portion 4 is formed with a slit portion 5 in a generally U-shaped shape which opens toward the front side of the gimbal portion 4 when viewed in plan view. In the region widthwise interposed between the two linear portions of the slit portion 5, a head-slider mounting portion 9 is provided.

The head-slider mounting portion 9 is a region for mounting a head slider 27 thereon, and defined in a generally rectangular shape when viewed in plan view in the region widthwise interposed between the two linear portions of the slit portion 5.

The conductive pattern 13 integrally includes external connection terminal portions 16, magnetic-head-side connection terminal portions 17, and signal wires 15 for connecting the external connection terminal portions 16 and the magnetic-head-side connection terminal portions 17.

A plurality of the (four) signal wires 15 are provided along the longitudinal direction of the suspension board with circuit 1, and arranged in parallel to be spaced apart from each other in the widthwise direction.

The plurality of signal wires 15 include a first wire 15a, a second wire 15b, a third wire 15c, and a fourth wire 15d which are arranged in this order from one widthwise side toward the other widthwise side.

More specifically, in the wiring portion 3, the first wire 15a, the second wire 15b, the third wire 15c, and the fourth wire 15d are formed to extend in parallel with each other. In the gimbal portion 4, the first wire 15a and the second wire 15b are disposed on one widthwise outside of the slit portion 5, while the third wire 15c and the fourth wire 15d are disposed on the other widthwise outside of the slit portion 5. The first wire 15a, the second wire 15b, the third wire 15c, and the fourth wire 15d are disposed to extend in the longitudinal direction till reaching the front end portion of the gimbal portion 4, extend inwardly in the widthwise direction of the gimbal portion 4, further fold back toward the longitudinal rear side of the gimbal portion 4, and then reach the front end portion of the magnetic-head-side connection terminal portions 17.

A plurality of the (four) external connection terminal portions 16 are provided to be disposed at the rear end portion of the wiring portion 3, and connected to the respective rear end portions of the signal wires 15. The external connection terminal portions 16 are arranged to be spaced apart in the widthwise direction. The external connection terminal portions 16 include a first external connection terminal portion 16a, a second external connection terminal portion 16b, a third external connection terminal portion 16c, and a fourth external connection terminal portion 16d which are arranged in this order from one widthwise side toward the other widthwise side to correspond to the first wire 15a, the second wire 15b, the third wire 15c, and the fourth wire 15d connected to the external connection terminal portions 16. The external connection terminal portions 16 are connected to terminal portions, not shown, of an external circuit board 2 indicated by broken line.

The magnetic-head-side connection terminal portions 17 are disposed at the gimbal portion 4. More specifically, the magnetic-head-side connection terminal portions 17 are disposed adjacent to the front end portion of the head-slider mounting portion 9. A plurality of the (four) magnetic-head-side connection terminal portions 17 are provided to be connected to the respective front end portions of the individual signal wires 15.

More specifically, the magnetic-head-side connection terminal portions 17 are arranged along the front end edge of the head-slider mounting portion 9 to be spaced apart from each other in the widthwise direction. The magnetic-head-side connection terminal portions 17 include a first magnetic-head-side connection terminal portion 17a, a second magnetic-head-side connection terminal portion 17b, a third magnetic-head-side connection terminal portion 17c, and a fourth magnetic-head-side connection terminal portion 17d which are arranged in this order from one widthwise side toward the other widthwise side to correspond to the first wire 15a, the second wire 15b, the third wire 15c, and the fourth wire 15d connected thereto. The magnetic-head-side connection terminal portions 17 are connected to terminal portions, not shown, of the magnetic head 28.

As shown in FIG. 3, the suspension board with circuit 1 includes a metal supporting board 11, the insulating base layer 12 formed on the surface of the metal supporting board 11, the conductive pattern 13 formed on the surface of the insulating base layer 12, and the insulating cover layer 14 formed on the surface of the insulating base layer 12 so as to cover the conductive pattern 13.

As shown in FIGS. 1 and 3, the metal supporting board 11 is formed to correspond to the respective outer shapes of the slit portion 5 and the suspension board with circuit 1.

The insulating base layer 12 is formed so as to correspond to respective positions in the wiring portion 3 and the gimbal portion 4 where the conductive pattern 13 is formed, and expose the peripheral end edge of the metal supporting board 11, and the portion thereof corresponding to the slit portion 5. More specifically, the insulating base layer 12 is formed in a flat belt shape which is slightly shorter than the metal supporting board 11 in the longitudinal direction and the widthwise direction.

The conductive pattern 13 is disposed over the wiring portion 3 and the gimbal portion 4, and formed as a wired circuit pattern which integrally includes the external connection terminal portions 16, the magnetic-head-side connection terminal portions 17, and the signal wires 15, as described above.

The insulating cover layer 14 is disposed over the wiring portion 3 and the gimbal portion 4 so as to correspond to the positions where the signal wires 15 are formed. The insulating cover layer 14 is formed so as to expose the portion corresponding to the slit portion 5, the external connection terminal portions 16, and the magnetic-head-side connection terminal portions 17, and cover the signal wires 15.

As shown in FIG. 1, the suspension board with circuit 1 is provided with a thermally assisting portion 18 used for a thermally assisted method.

The thermally assisting portion 18 includes an optical waveguide 19, and a light emitting element 20.

In the suspension board with circuit 1, a light-emitting-element mounting portion 37 is defined for the light emitting element to be provided thereon.

The light-emitting-element mounting portion 37 is a region for mounting the light emitting element 20 thereon. The light-emitting-element mounting portion 37 is disposed at the widthwise center of the rear portion of the wiring portion 3 to be closer to the front side than the external connection terminal portions 16, and defined in a generally rectangular shape extending in the longitudinal direction when viewed in plan view.

As shown in FIG. 2, the suspension board with circuit 1 is provided with a magnetic-head-side opening 7, a light-emitting-element-side opening 25, and a board trench portion 35 for the optical waveguide 19 and the light emitting element 20 to be provided thereon.

The magnetic-head-side opening 7 is disposed at the widthwise center of the front end portion of the head-slider mounting portion 9, and formed in a generally rectangular shape extending through the metal supporting board 11, the insulating base layer 12, and the insulating cover layer 14 in the thickness direction when viewed in plan view.

The light-emitting-element-side opening 25 is provided at the widthwise center of the light-emitting-element mounting portion 37, and formed in a generally rectangular shape extending through the metal supporting board 11, the insulating base layer 12, and the insulating cover layer 14 in the thickness direction when viewed in plan view.

The board trench portion 35 is formed linearly along the longitudinal direction between the magnetic-head-side opening 7 and the light-emitting-element-side opening 25 so as to couple the magnetic-head-side opening 7 to the light-emitting-element-side opening 25 at the widthwise center of each of the wiring portion 3 and the gimbal portion 4. As shown in FIG. 3, the board trench portion 35 is formed of an elongated trench in a generally rectangular cross-sectional shape which extends through the metal supporting board 11 in the thickness direction, and downwardly opens so as to expose the bottom surface of the insulating base layer 12.

That is, the board trench portion 35 is defined by the both inner side surfaces of the foregoing opening in the metal supporting board 11 and by the bottom surface of the insulating base layer 12.

The light emitting element 20 is a light source for causing light to be incident in the optical waveguide 19. For example, the light emitting element 20 converts electrical energy to optical energy to emit high-energy light. The light emitting element 20 is disposed on the light-emitting-element mounting portion 37 such that light emitted from the light emitting element 20 is incident in the inside of the light-emitting-element-side opening 25.

The light emitting element 20 is connected to a supply wire 30 for supplying electrical energy to the light emitting element 20. The supply wire 30 is connected to a supply terminal portion 31 connected to the terminal portion, not shown, of the external circuit board 2.

The supply wire 30 extends rearwardly from the rear end of the light emitting element 20, and the supply terminal portion 31 is disposed to be spaced apart from the external connection terminal portions 16 in the widthwise direction. The supply wire 30 is covered with the insulating cover layer 14, while the supply terminal portion 31 is exposed from the insulating cover layer 14.

The optical waveguide 19 is disposed to overlap the board trench portion 35 provided in the metal supporting board 11 when the metal supporting board 11 is projected in the thickness direction 11. Specifically, the optical waveguide 19 is contained in the board trench portion 35.

The optical waveguide 19 is formed in a generally rectangular cross-sectional shape having the same widthwise length and the same vertical length as those of the board trench portion 35.

The optical waveguide 19 is fitted in the board trench 35 such that a bottom surface thereof is flush with the bottom surface of the metal supporting board 11.

Figure 4:
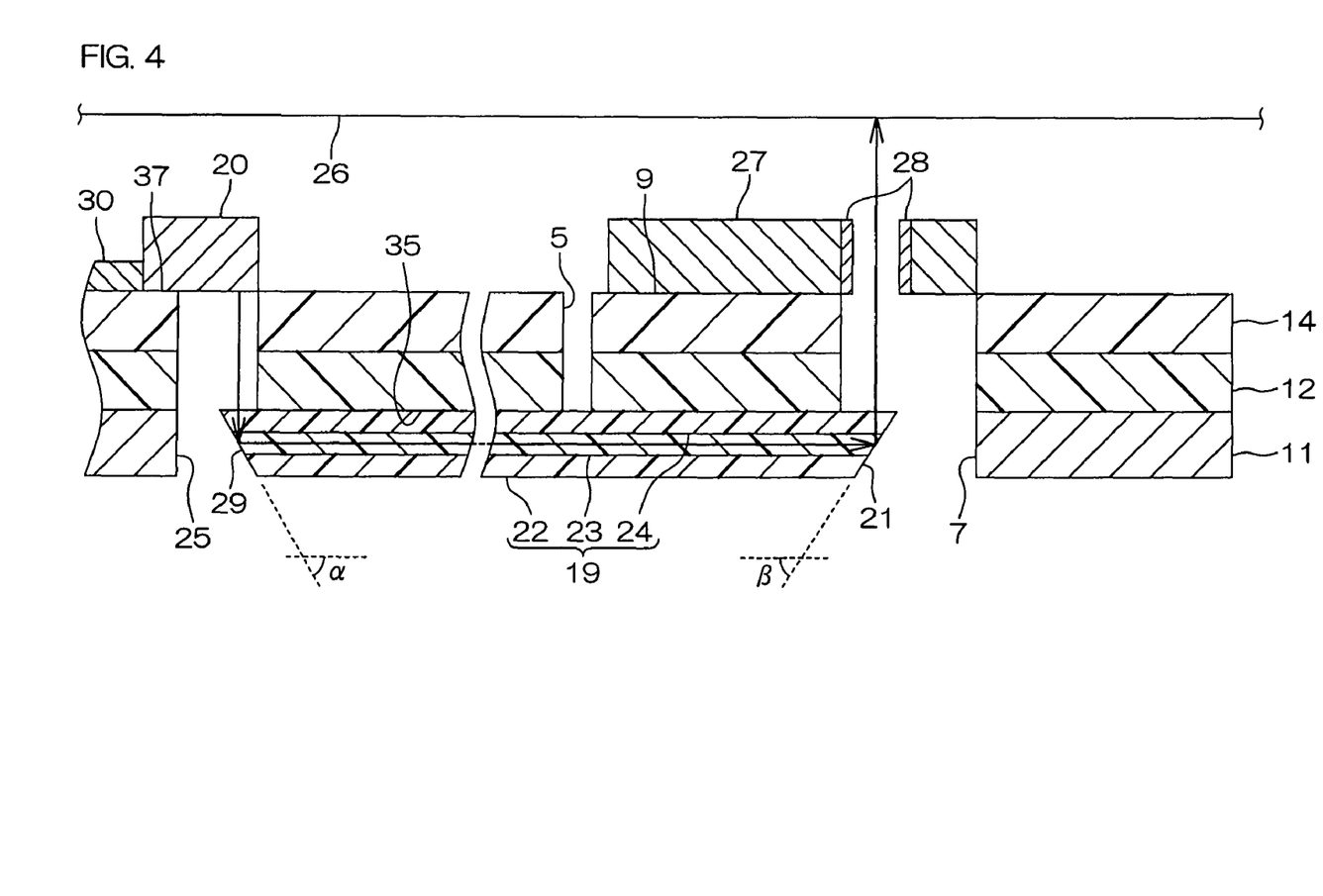
FIG. 4 is a view illustrating a state in which information is recorded to a hard disk using a thermally assisted method.

As shown in FIG. 4, in the suspension board with circuit 1, the optical waveguide 19 is linearly disposed in the board trench portion 35 to be continuously provided between a position within the light-emitting-element-side opening 25 of the wiring portion 3 and a position within the magnetic-head-side opening 7 of the gimbal portion 4.

A magnetic-head-side end surface 21 as the front end surface of the optical waveguide 19 is disposed so as to face the magnetic-head-side opening 7, while a light-emitting-element-side end surface 29 as the rear end surface thereof is disposed so as to face the light-emitting-element-side opening 25.

The light-emitting-element-side end surface 29 is disposed to oppose the emission window of the light emitting element 20 in the thickness direction with interposition of the light-emitting-element-side opening 25.

The light-emitting-element-side end surface 29 is formed as an inclined surface which is frontwardly inclined from the upper end thereof toward the lower end thereof so as to, e.g., cross the longitudinal direction of the optical waveguide 19 at a predetermined angle (inclination angle) α. As a result, the light-emitting-element-side end surface 29 serves as a reflection surface having the inclination angle α, and the light emitted from the light emitting element 20 passes through the light-emitting-element-side opening 25 to have an optical path thereof changed at a predetermined angle by the light-emitting-element-side end surface 29, and is then incident on the optical waveguide 19.

The magnetic-head-side end surface 21 is formed as an inclined surface which is rearwardly inclined from the upper end thereof toward the lower end thereof so as to, e.g., cross the longitudinal direction of the optical waveguide 19 at a predetermined angle (inclination angle) β. As a result, the magnetic-head-side end surface 21 serves as a reflection surface having the inclination angle β, and the light emitted from the optical waveguide 19 has an optical path thereof changed at a predetermined angle by the magnetic-head-side end surface 21, and is then emitted toward the magnetic-head-side opening 7.

The inclination angles α and β are not particularly limited, and are in a range of, e.g., 35 to 55°, preferably 40 to 50°, or more preferably 45°.

As described later, the optical waveguide 19 includes an underclad layer 22, a core layer 23 formed on the underclad layer 22, and an overclad layer 24 formed on the underclad layer 22 so as to cover the core layer 23.

The suspension board with circuit 1 is typically mounted in the hard disk drive, and uses a thermally assisted method.

Figure 5:
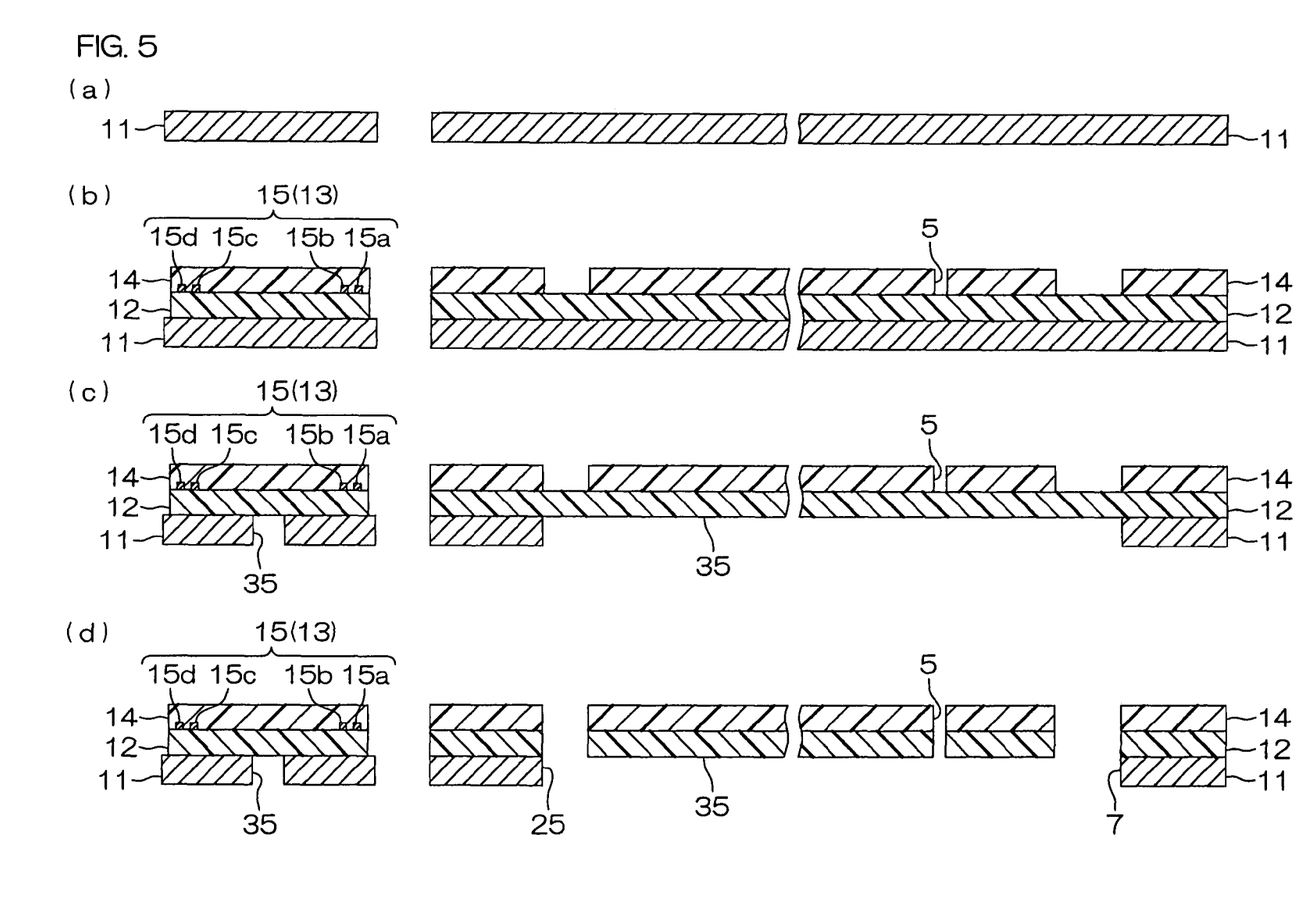
FIG. 5 is a cross-sectional view showing the steps of producing the suspension board with circuit shown in FIG. 3, including a left-side view as a cross-sectional view corresponding to FIG. 3, and a right-side view as a cross-sectional view along the optical waveguide, (a) showing the step of preparing a metal supporting board, (b) showing the step of laminating an insulating base layer, a conductive pattern, and an insulating cover layer on a surface of the metal supporting board, (c) showing the step of providing a board trench portion in the metal supporting board, and (d) showing the step of forming a magnetic-head-side opening and a light-emitting-element-side opening.
Figure 6:
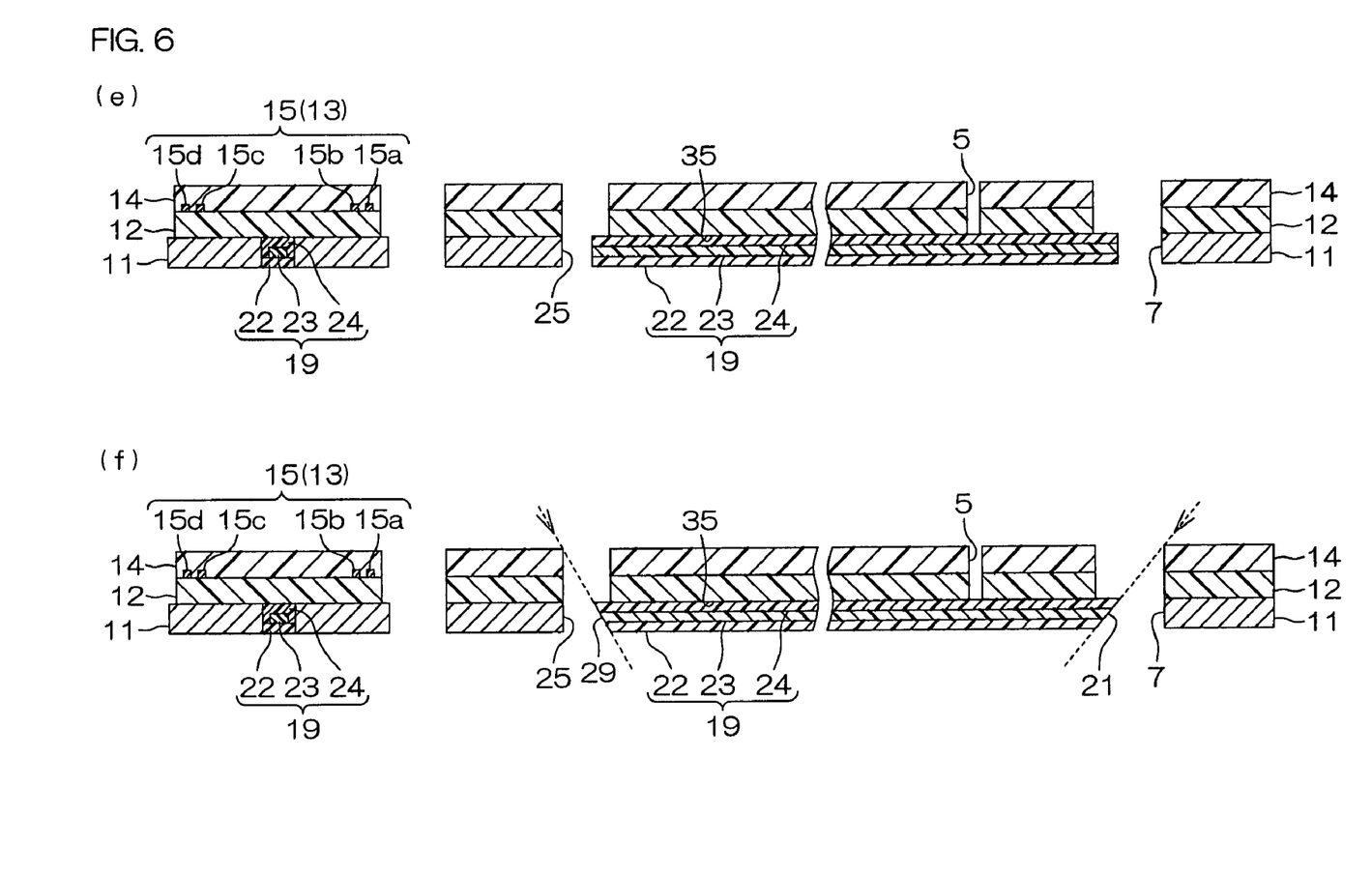
FIG. 6 is a cross-sectional view showing, subsequently to FIG. 5, the steps of producing the suspension board with circuit shown in FIG. 3, including a left-side view as a cross-sectional view corresponding to FIG. 3, and a right-side view as a cross-sectional view along the optical waveguide, (e) showing the step of placing the optical waveguide in the board trench portion, and (f) showing the step of forming a magnetic-head-side end surface and a light-emitting-element-side end surface.

FIGS. 5 and 6 are cross-sectional views showing the steps of producing the suspension board with circuit shown in FIG. 3, including a left-side view as a cross-sectional view corresponding to FIG. 3, and a right-side view as a cross-sectional view along the optical waveguide.

Next, a producing method of the suspension board with circuit 1 is described with reference to FIGS. 5 and 6.

In the method, as shown in FIG. 5(*a*), the metal supporting board 11 is prepared first.

The metal supporting board 11 is formed of a metal material such as stainless steel, a 42-alloy, aluminum, a copper-beryllium alloy, or phosphor bronze. The thickness of the metal supporting board 11 is in a range of, e.g., 10 to 30 μm, or preferably 15 to 25 μm.

Next, as shown in FIG. 5(*b*), the insulating base layer 12, the conductive pattern 13, and the insulating cover layer 14 are successively laminated on the surface of the metal supporting board 11.

To successively laminate the insulating base layer 12, the conductive pattern 13, and the insulating cover layer 14, the insulating base layer 12 is formed first on the surface of the metal supporting board 11.

Examples of an insulating material which forms the insulating base layer 12 include synthetic resins such as a polyimide resin, a polyamideimide resin, an acrylic resin, a polyether nitrile resin, a polyether sulfone resin, a polyethylene terephthalate resin, a polyethylene naphthalate resin, and a polyvinyl chloride resin. Preferably, the insulating base layer 12 is formed of a polyimide resin.

To form the insulating base layer 12, e.g., a varnish of a photosensitive insulating material is coated on the surface of the metal supporting board 11, dried, exposed to light via a photomask, developed, and then cured as necessary.

The insulating base layer 12 thus formed has a thickness is in a range of, e.g., 1 to 35 μm, or preferably 8 to 15 μm.

Next, the conductive pattern 13 is formed in the foregoing pattern.

Examples of a conductive material which forms the conductive pattern 13 include copper, nickel, tin, gold, a solder, and an alloy thereof.

To form the conductive pattern 13, e.g., a known patterning method such as an additive method or a subtractive method is used. Preferably, the additive method is used.

The conductive pattern thus formed has a thickness in a range of, e.g., 3 to 50 μm, or preferably 5 to 20 μm. The width of each of the signal wires 15 is in a range of, e.g., 5 to 200 μm, or preferably 10 to 100 μm. The spacing between the individual signal wires 15 is in a range of, e.g., 5 to 1000 μm, or preferably 10 to 100 μm.

The widths of the external connection terminal portions 16 and the magnetic-head-side connection terminal portions 17 are in a range of, e.g., 20 to 1000 μm, or preferably 30 to 800 μm. The spacing between the individual external connection terminal portions 16 and the spacing between the individual magnetic-head-side connection terminal portions 17 are in a range of, e.g., 20 to 1000 μm, or preferably 30 to 800 μm.

The insulating cover layer 14 is formed of any of the insulating materials shown by way of example for forming the insulating base layer 12.

To form the insulating cover layer 14 in the foregoing pattern, e.g., a varnish of a photosensitive insulating material is coated on the surface of the metal supporting board 11 including the conductive pattern 13 and the insulating base layer 12, dried, exposed to light via a photomask, developed, and then cured as necessary. The insulating cover layer 14 thus formed has a thickness in a range of, e.g., 1 to 40 μm, or preferably 2 to 10 μm.

As a result, the insulating cover layer 14 is formed in a pattern in which the portions corresponding to the slit portion 5, the external connection terminal portions 16, the magnetic-head-side connection terminal portions 17, the light-emitting-element-side opening 25, and the magnetic-head-side opening 7 are opened, and the signal wires 15 are covered.

In this manner, the insulating base layer 12, the conductive pattern 13, and the insulating cover layer 14 can be successively laminated on the surface of the metal supporting board 11.

While the conductive pattern 13 mentioned above is formed, the supply wire 30 and the supply terminal portion 31 are simultaneously formed by the same method as described above.

Next, as shown in FIG. 5(*c*), the board trench portion 35 is provided in the metal supporting board 11.

The board trench portion 35 is formed by, e.g., perforation such as drilling, etching such as dry etching or wet etching, or the like. Preferably, the board trench portion 35 is formed by wet etching.

The board trench portion 35 thus provided has a width in a range of, e.g., 5 to 250 μm, or preferably 10 to 150 μm, and a length (longitudinal length) in a range of, e.g., 5 to 100 mm, or preferably 10 to 50 mm.

At the same time as the board trench portion 35 is formed, the portions of the metal supporting board 11 corresponding to the magnetic-head-side opening 7 and the light-emitting-element-side opening 25 are also etched. As necessary, trimming of the metal supporting board 11 is also simultaneously performed.

Next, as shown in FIG. 5(*d*), the magnetic-head-side opening 7 and the light-emitting-element-side opening 25 are formed to extend through the insulating base layer 12 in the thickness direction.

The insulating base layer 12 may be etched appropriately by a known method. For example, the magnetic-head-side opening 7 and the light-emitting-element-side opening 25 are formed by chemical etching, plasma etching, or the like. Preferably, the magnetic-head-side opening 7 and the light-emitting-element-side opening 25 are formed by chemical etching.

The magnetic-head-side opening 7 and the light-emitting-element-side opening 25 thus formed have widths in a range of, e.g., 50 to 500 µm, or preferably 100 to 200 µm, and lengths (longitudinal lengths) in a range of, e.g., 50 to 500 µm, or preferably 100 to 200 µm.

Next, as shown in FIG. 6(e), the optical waveguide 19 is placed in the board trench portion 35.

The optical waveguide 19 is formed separately, and obtained by successively laminating the underclad layer 22, the core layer 23, and the overclad layer 24, and curing the laminated layers. Specifically, a supporting plate 34 (see FIG. 8), e.g., is prepared, and the underclad layer 22, the core layer 23, and the overclad layer 24 are successively laminated on the surface of the supporting plate 34.

A material for forming the supporting plate 34 is not particularly limited. For example, stainless steel, a 42-alloy, aluminum, a copper-beryllium alloy, phosphor bronze, or the like is used to form the supporting plate 34.

To successively laminate the underclad layer 22, the core layer 23, and the overclad layer 24, the underclad layer 22 is formed first on the surface of the supporting plate 34.

Examples of a material used to form the underclad layer 22 include a polyimide resin, a polyamide resin, a silicone resin, an epoxy resin (such as an alicyclic epoxy resin), an acrylic resin, a fluorene derivative resin, a resin mixture of a fluorene derivative resin and an alicyclic epoxy resin, and a resin mixture of any of the resins listed above and an alicyclic ether compound (such as an oxetane compound). The resins listed above are each used as a photosensitive resin obtained by mixing a photosensitizer therein. Preferably, a resin mixture of a photosensitive fluorene derivative resin (produced from a photosensitive fluorene epoxy resin as a raw material) and an alicyclic epoxy resin. As the photosensitizer, a known onium salt is used, for example. More specifically, 4,4-bis[di(β-hydroxyethoxy)phenylsulfinio)phenylsulfide-bis-hexafluoroantimonate or the like is used as the photosensitizer.

To form the underclad layer 22, e.g., a varnish (resin solution) of any of the resins mentioned above is prepared, coated on the surface of the supporting plate 34, dried, and then cured as necessary. In the case where a photosensitive resin is used, a varnish is coated, dried, exposed to light via a photomask, developed by dissolving an unexposed portion, and then cured as necessary.

The refractive index of the underclad layer 22 is in a range of, e.g., 1.45 to 1.55. The thickness of the underclad layer 22 is in a range of, e.g., 1 to 50 µm, or preferably 5 to 20 µm. The width of the underclad layer 22 is in a range of, e.g., 5 to 200 µm, or preferably 10 to 100 µm.

Then, the core layer 23 is formed on the underclad layer 22.

As a material for forming the core layer 23, a resin material having a refractive index higher than that of the resin material of the underclad layer 22 is used. Examples of such a resin material include the same resins as mentioned above. Preferably, a resin mixture of a fluorene derivative resin (produced from a photosensitive fluorene epoxy resin) and an oxetane compound is used.

To form the core layer 23, e.g., a varnish (resin solution) of the resin mentioned above is prepared, and the varnish is coated on the surface of the underclad layer 22, dried, and then cured as necessary. In the case where a photosensitive resin is used, a varnish is coated, dried, exposed to light via a photomask, developed by dissolving an unexposed portion, and then cured as necessary.

The refractive index of the core layer 23 is set higher than that of the underclad layer 2-2, and is in a range of, e.g., 1.55 to 1.65. The thickness of the core layer 23 is in a range of, e.g., 1 to 30 µm, or preferably 2 to 20 µm. The width of the core layer 23 is in a range of, e.g., 1 to 30 µm, or preferably 2 to 20 µm.

Then, the overclad layer 24 is formed on the underclad layer 22 so as to cover the core layer 23.

As a material for forming the overclad layer 24, the same resin material as used to form the underclad layer 22 mentioned above is used.

To form the overclad layer 24, e.g., a varnish (resin solution) of the resin mentioned above is prepared, and the varnish is coated on the surface of the underclad layer 22 including the core layer 23, dried, and then cured as necessary. In the case where a photosensitive resin is used, a varnish is coated, dried, exposed to light via a photomask, developed by dissolving an unexposed portion, and then cured as necessary.

The refractive index of the overclad layer 24 is set lower than that of the core layer 23. For example, the refractive index of the overclad layer 24 is set to the same range as that of the refractive index of the underclad layer 22. The thickness of the overclad layer 24 measured from the surface of the core layer 23 is in a range of, e.g., 1 to 50 µm, or preferably 5 to 20 µm. The width of the overclad layer 24 is in a range of, e.g., 5 to 200 µm, or preferably 10 to 100 µm.

Thus, by successively laminating the underclad layer 22, the core layer 23, and the overclad layer 24 on the supporting plate 34, the optical waveguide 19 can be formed.

Then, the optical waveguide 19 is stripped from the supporting plate 34, and placed in the board trench portion 35.

To place the optical waveguide 19 in the board trench portion 35, e.g., an adhesive is coated on the upper surface of the optical waveguide 19, and on the both side surfaces thereof as necessary. Then, the optical waveguide 19 is fitted in the board trench portion 35. As a result, the upper surface of the optical waveguide 19 is adhered to (brought into close contact with) the bottom surface of the insulating base layer 12 which is exposed in the board trench portion 35, and the both side surfaces of the optical waveguide 19 are adhered to (brought into close contact with) the both inner side surfaces of the board trench portion 35 in the metal supporting board 11 as necessary.

As a result, the front end portion of the optical waveguide 19 is disposed to overlap the magnetic-head-side opening 7 in the thickness direction of the metal supporting board 11. More specifically, in the widthwise direction, the front end portion of the optical waveguide 19 is disposed at the center of the magnetic-head-side opening 7, while in the longitudinal direction, the front end portion of the optical waveguide 19 is disposed at the rear half of the magnetic-head-side opening 7.

The rear end portion of the optical waveguide 19 is disposed to overlap the light-emitting-element-side opening 25 in the thickness direction of the metal supporting board 11. More specifically, in the widthwise direction, the rear end portion of the optical waveguide 19 is disposed at the center of the light-emitting-element-side opening 25, while in the longitudinal direction, the rear end portion of the optical waveguide 19 is disposed at the front half of the light-emitting-element-side opening 25.

Next, as shown in FIG. 6(f), the front end portion of the optical waveguide 19 is cut in the magnetic-head-side-opening 7 by laser processing from the side to be provided with the magnetic head 28 to form the magnetic-head-side end surface 21.

In the laser processing, as indicated by the broken line of FIG. 6(f), laser light passing through the magnetic-head-side opening 7 is caused to be incident from the side to be provided with the magnetic head 28 (downwardly in the thickness direction) so as to cross the longitudinal direction at a predetermined angle.

Next, in the same manner as in the method described above, the rear end portion of the optical waveguide 19 is cut in the light-emitting-element-side opening 25 by laser processing from the side to be provided with the light emitting element 20 (downwardly in the thickness direction) to form the light-emitting-element-side end surface 29.

Thereafter, at the rear end side of the wiring portion 3, the light emitting element 20 is disposed on the light-emitting-element mounting portion 37 of the insulating cover layer 14 such that the light emitted from the light emitting element 20 is incident on the inside of the light-emitting-element-side opening 25, whereby the suspension board with circuit 1 is obtained.

Then, as indicated by the broken lines of FIGS. 1 and 2, the external connection terminal portions 16 and the supply terminal portion 31 in the wiring portion 3 of the suspension board with circuit 1 are connected to the terminal portions, not shown, of the external circuit board 2. On the external circuit board 2, an IC 32 for controlling the magnetic head 28 (see FIG. 4) and the light emitting element 20 are mounted, and electrically connected via an IC wire 33 to the terminal portions connected to the external connection terminal portions 16 and to the supply terminal portion 31.

As shown in FIGS. 1 and 4, the head slider 27 is mounted on the head-slider mounting portion 9 of the gimbal portion 4. On the head slider 27, the magnetic head 28 is mounted. By mounting the head slider 27 mentioned above, the terminal portions, not shown, of the magnetic head 28 are electrically connected to the magnetic-head-side connection terminal portions 17. Also, by mounting the head slider 27 mentioned above, the magnetic head 28 is disposed to face the magnetic-head-side opening 7, and oppose the magnetic-head-side end surface 21 of the optical waveguide 19 in the thickness direction with interposition of the magnetic-head-side opening 7.

In the hard disk drive in which the magnetic head 28, the head slider 27, the suspension board with circuit 1, and the external circuit board 2 are mounted, a thermally assisted method can be used.

After the magnetic head 28, the head slider 27, and the external circuit board 2 are mounted, the suspension board with circuit 1 is inserted into the block E of the hard disk drive.

In the hard disk drive, the hard disk 26 travels relatively to the magnetic-head-side end surface 21 of the optical waveguide 19 and to the magnetic head 28. Then, after the light downwardly emitted from the light emitting element 20 passes through the light-emitting-element-side opening 25, the optical path of the light is changed at the light-emitting-element-side end surface 29 into a direction parallel with the metal supporting board 11 so that the light passes through the optical waveguide 19. Thereafter, the optical path of the light is upwardly changed again at the magnetic-head-side end surface 21 so that the light successively passes through the magnetic-head-side opening 7 and the magnetic head 28 to irradiate the surface of the hard disk 26 which opposes the magnetic head 28 from above. As a result, the irradiated portion of the hard disk 26 is heated. Radiation of a magnetic field from the magnetic head 28 records information to the hard disk 26. Because the coersive force of the hard disk 26 has been reduced, the radiation of a small magnetic field is sufficient to enable high-density recording of the information to the hard disk 26.

In the suspension board with circuit 1, the optical waveguide 19 is contained in the board trench portion 35. That is, the bottom surface of the optical waveguide 19 is fitted in the board trench portion 35 so as to be flush with the bottom surface of the metal supporting board 11. As a result, the optical waveguide 19 does not protrude from the bottom surface of the suspension board with circuit 1. Therefore, it is possible to reduce the degree to which insertion of the suspension board with circuit 1 into the block E is interrupted by the optical waveguide 19, and reduce damage received by the optical waveguide 19 from the block E.

While the conductive pattern 13 is formed on the surface of the insulating base layer 12, the optical waveguide 19 is disposed at the back surface side of the insulating baser layer 12. This ensures design flexibility of the suspension board with circuit 1.

In the description given above, the trench portion in which the optical waveguide 19 is disposed is provided in the metal supporting board 11. However, the trench portion can also be provided in, e.g., the insulating base layer 12.

Figure 7:
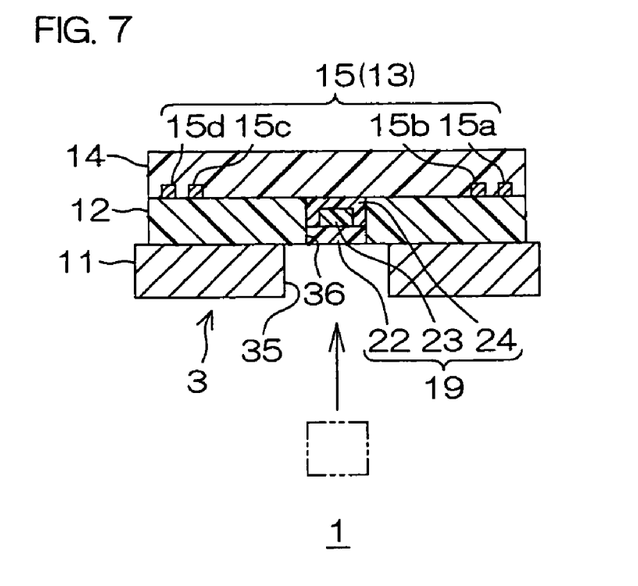
FIG. 7 is a cross-sectional view showing another embodiment (a configuration in which the optical waveguide is contained in a base trench portion) of the suspension board with circuit shown in FIG. 3.

FIG. 7 is a cross-sectional view showing another embodiment (a configuration in which the optical waveguide is contained in a base trench portion) of the suspension board with circuit shown in FIG. 3. In FIG. 7, the members corresponding to the individual components mentioned above are designated by the same reference numerals, and a detailed description thereof is omitted.

In the suspension board with circuit 1, the board trench portion 35 is formed wider than the board trench portion 35 shown in FIG. 3, and the insulating base layer 12 is formed to have the same thickness as that of the optical waveguide 19.

In the insulating base layer 12, a base trench portion 36 is formed at the widthwise center of the board trench portion 35 so as to overlap the board trench portion 35 in the thickness direction of the metal supporting board 11.

The base trench portion 36 is formed narrower than the board trench portion 35 in FIG. 7. Specifically, the base trench portion 36 is formed to have the same width as that of the board trench portion 35 shown in FIG. 3. The base trench portion 36 connects to the light-emitting-element-side opening 25, similarly to the magnetic-head-side opening 7 and the board trench portion 35. The base trench portion 36 is formed of an elongated trench having a generally rectangular cross-sectional shape which extends through the insulating base layer 12 in the thickness direction, and is downwardly opened so as to expose the bottom surface of the insulating cover layer 14. That is, the base trench portion 36 is defined by the both inner side surfaces of the foregoing opening in the insulating base layer 12 and by the bottom surface of the insulating cover layer 14.

The base trench portion 36 can be formed by etching the insulating base layer 12 by the chemical etching mentioned above.

In the suspension board with circuit 1, the optical waveguide 19 is contained in the base trench portion 36 provided in the insulating base layer 12.

To place the optical waveguide 19 in the base trench portion 36, e.g., an adhesive is coated on the upper surface of the optical waveguide 19, and on the both side surfaces thereof as necessary. Then, the optical waveguide 19 is fitted into the base trench portion 36. As a result, the upper surface of the optical waveguide 19 is adhered to (brought into close contact with) the bottom surface of the insulating cover layer 14 which is exposed in the base trench portion 36, and the both side surfaces of the optical waveguide 19 is adhered to (brought into close contact with) the both inner side surfaces of the base trench portion 36 in the insulating base layer 12 as necessary.

In the suspension board with circuit 1, since the optical waveguide 19 is contained in the base trench portion 36, the optical waveguide 19 can be disposed at a position inner than the metal supporting board 11. As a result, it is possible to further reduce the degree to which insertion of the suspension board with circuit 1 into the block E is interrupted by the optical waveguide 19, and reduce damage received by the optical waveguide 19 from the block E.

Figure 8:
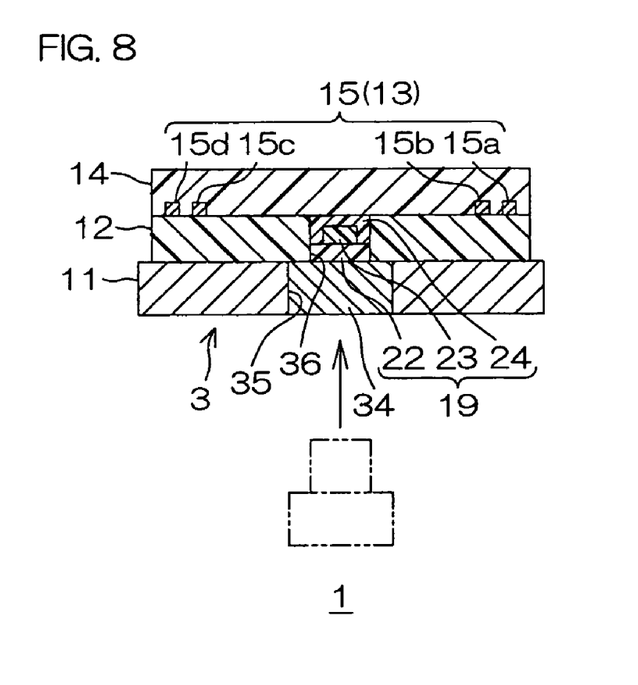
FIG. 8 is a cross-sectional view showing another embodiment (a configuration in which the optical waveguide is contained in the base trench portion, and a supporting plate is fitted in the board trench portion) of the suspension board with circuit shown in FIG. 7.

FIG. 8 is a cross-sectional view showing another embodiment (a configuration in which the optical waveguide is contained in the base trench portion, and the supporting plate is fitted in the board trench portion) of the suspension board with circuit shown in FIG. 7. In FIG. 8, the members corresponding to the individual components mentioned above are designated by the same reference numerals, and a detailed description thereof is omitted.

In the embodiment shown in FIG. 7, the optical waveguide 19 is stripped from the supporting plate 34, and contained in the base trench portion 36. However, the optical waveguide 19 supported by the supporting plate 34 can also be contained as it is in the base trench portion 36 without being stripped from the supporting plate 34.

In the embodiment, the supporting plate 34 is formed in a generally rectangular flat plate shape when viewed in cross-section which has the same widthwise length and the same vertical length as those of the board trench portion 35.

In the suspension board with circuit 1, the optical waveguide 19 is contained in the base trench portion 36 provided in the insulating base layer 12, while the supporting plate 34 is fitted in the board trench portion 35 provided in the metal supporting board 11.

To place the optical waveguide 19 in the base trench portion 36 while fitting the supporting plate 34 into the board trench portion 35, e.g., an adhesive is coated on the upper surface of the optical waveguide 19, and on the both side surfaces thereof as necessary, and the adhesive is further coated on the both side surfaces of the supporting plate 34 as necessary. Then, the optical waveguide 19 is fitted into the base trench portion 36, while the supporting plate 34 is fitted into the board trench portion 35. As a result, the upper surface of the optical waveguide 19 is adhered to (brought into close contact with) the bottom surface of the insulating cover layer 14 which is exposed in the base trench portion 36, and the both side surfaces of the optical waveguide 19 is adhered to (brought into close contact with) the both inner side surfaces of the base trench portion 36 in the insulating base layer 12 as necessary. Further, the both side surfaces of the supporting plate 34 are adhered to (brought into close contact with) the both inner side surfaces of the board trench portion 35 in the metal supporting board 11 as necessary.

As long as the optical waveguide 19 is contained in the base trench portion 36, and the supporting plate 34 is fitted in the board trench portion 35, it is possible to ensure reliable positioning of the optical waveguide 19 with respect to the suspension board with circuit 1. This allows an improvement in the transmission efficiency of the optical waveguide 19. Since the supporting plate 34 is provided on the lower surface of the optical waveguide 19, the optical waveguide 19 can be prevented from being damaged by the block E.

In the description given above, the optical waveguide 19 is contained in the board trench portion 35 or the base trench portion 36. However, it is sufficient for the optical waveguide 19 to be disposed at a position overlapping the board trench portion 35, and closer to the conductive pattern 13 than to the back surface of the metal supporting board 11 when projected in the thickness direction of the metal supporting board 11. A part of the optical waveguide 19 may downwardly protrude from the board trench portion 35.

In the description given above, voids are produced in the magnetic-head-side opening 7 and the light-emitting-element-side opening 25. However, the voids can also be sealed with an adhesive or the like for the prevention of an optical loss.

In the description given above, the single optical waveguide 19 is provided in the suspension board with circuit 1. However, the number of the optical waveguides 19 is not particularly limited. For example, a plurality of the optical waveguides 19 can also be provided depending on the application and purpose thereof.

In the description given above, the both widthwise side surfaces of the optical waveguide 19 are brought into close contact with the both inner side surfaces of the board trench portion 35 in the metal supporting board 11, or with the both inner side surfaces of the base trench portion 36 in the insulating base layer 12. However, the optical waveguide 19 can also be provided such that the both widthwise side surfaces thereof are spaced apart from the both inner side surfaces of the board trench portion 35, or from the both inner side surfaces of the base trench portion 36. In that case, the width of the optical waveguide 19 is formed smaller than the width of the board trench portion 35 or the width of the base trench portion 36.

In the embodiment described above, after the head slider 27 is mounted, the suspension board with circuit 1 may be curved with the head-slider mounting portion 9 at a desired angle. In such a case, the optical waveguide 19 which traverses the slit portion 5 is formed of a material which is elastically deformable with the curve.

EXAMPLES

Hereinbelow, the present invention is described more specifically by showing the examples. However, the present invention is by no means limited to the examples.

Example 1

Configuration in which Optical Waveguide is Contained in Board Trench Portion

A metal supporting board made of stainless steel having a thickness of 20 μm was prepared (see FIG. 5(a)).

Then, a polyamide resin was coated on the metal supporting board, dried, exposed to light via a photomask, developed, and then cured to form an insulating base layer in the foregoing pattern. The thickness of the insulating base layer was 10 μm.

Then, by an additive method, a conductive pattern, a supply wire, and a supply terminal portion each made of copper were simultaneously formed. The thicknesses of the conductive pattern, the supply wire, and the supply terminal portion were 10 μm.

Then, a polyimide resin was coated on the insulating base layer, dried, exposed to light via a photomask, developed, and then cured to form an insulating cover layer in the foregoing pattern. The thickness of the insulating cover layer was 5 μm. In this manner, the insulating base layer, the conductive pattern, and the insulating cover layer were successively laminated on the metal supporting board (see FIG. 5(b)).

Then, a board trench portion was provided at the widthwise center portion of the meal supporting board to extend along the longitudinal direction thereof by wet etching (see FIG.

5(c)). The width of the board trench portion was 100 μm, and the length thereof was 20 mm.

Then, the insulating base layer was etched by chemical etching to form a magnetic-head-side opening and a light-emitting-element-side opening each extending through the metal supporting board, the insulating base layer, and the insulating cover layer in the thickness direction thereof (see FIG. 5(d)). The widths of the magnetic-head-side opening and the light-emitting-element-side opening were 100 μm, and the lengths thereof were 100 μm.

Meanwhile, a supporting plate made of stainless steel was separately prepared, and an optical waveguide was formed thereon. The thickness of the supporting plate was 20 μm.

In the formation of an underclad layer, a vanish was prepared first by mixing 35 parts by weight of bisphenoxyethanol fluorenediglycidyl ether (a fluorene derivative having an epoxy equivalent of 300 g/eq.), 25 parts by weight of an alicyclic epoxy resin (Celloxide 2081 commercially available from Daicel Industries, Ltd.) having a cyclohexene oxide structure, 2 parts by weight of a 50% 4,4-bis[di(β-hydroxyethoxy)phenylsulfinio]phenylsulfide-bis-hexafluoroantimonate (photosensitizer) of propione carbonate solution, and 40 parts by weight of 3,4-epoxy cyclohexenylmethyl-3',4'-epoxycyclohexene carboxylate (diluent, alicyclic epoxy, Celloxide 2021P commercially available from Daicel Industries, Ltd.).

Then, the varnish was coated on the surface of the supporting plate, and dried by heating it at 80° for 15 minutes. Subsequently, the varnish was exposed to light via a photomask, and then developed by dissolving an unexposed portion in a gammabutyrolactone-based organic solvent. Thereafter, the varnish was cured by heating it at 100° for 15 minutes to form the underclad layer on the supporting plate.

The refractive index of the underclad layer (cured underclad layer) at a wavelength of 830 nm was 1.540. The thickness of the underclad layer was 5 μm, and the width thereof was 80 μm.

Then, a core layer was formed on the underclad layer.

In the formation of the core layer, a varnish was prepared first by mixing 70 parts by weight of bisphenoxyethanol fluorenediglycidyl ether (a fluorene derivative having an epoxy equivalent of 300 g/eq.), 30 parts by weight of 1,1,1-tris{4-[2-(3-oxetanyl)]butoxyphenyl}ethane (oxetane compound), 1 part by weight of a 50% 4,4-bis[di(β-hydroxyethoxy)phenylsulfinio]phenylsulfide-bis-hexafluoroantimonate (photosensitizer) of propione carbonate solution, and 30 parts by weight of ethyl lactate (diluent).

Then, the varnish was coated on the surface of the underclad layer, and dried by heating it at 80° for 15 minutes. Subsequently, the varnish was exposed to light via a photomask, and then developed by dissolving an unexposed portion in a gammabutyrolactone-based organic solvent. Thereafter, the varnish was cured by heating it at 1000 for 15 minutes to form the core layer on the underclad layer.

The refractive index of the core layer (cured core layer) at a wavelength of 830 nm was 1.594. The thickness of the core layer was 5 μm, and the width thereof was 5 μm.

Then, an overclad layer was formed on the underclad layer so as to cover the core layer.

In the formation of the overclad layer, the same varnish as the varnish for forming the underclad layer mentioned above was prepared. Then, the varnish was coated on the surface of the underclad layer including the core layer, and dried by heating it at 80° for 15 minutes.

Subsequently, the varnish was exposed to light via a photomask, and then developed by dissolving an unexposed portion in a gammabutyrolactone-based organic solvent. Thereafter, the varnish was cured by heating it at 100° for 15 minutes to form the overclad layer on the underclad layer so as to cover the core layer.

The refractive index of the overclad layer at a wavelength of 830 nm was 1.540. The thickness of the overclad layer measured from the surface of the core layer was 5 μm, and the width thereof was 80 μm. In this manner, the optical waveguide was obtained.

Then, the optical waveguide was stripped from the supporting plate, and an adhesive was coated on the upper surface and both side surfaces of the optical waveguide.

Then, the upper surface of the optical waveguide was adhered to the bottom surface of the insulating base layer which was exposed in the board trench portion, and the both side surfaces of the optical waveguide were adhered to the both inner side surfaces of the board trench portion in the metal supporting board to place the optical waveguide in the board trench portion (see FIG. 6(e)).

Then, in the magnetic-head-side opening and the light-emitting-element-side opening, the front and rear end portions of the optical waveguide were simultaneously cut in a direction crossing the longitudinal direction by laser processing from the side to be provided with a magnetic head and from the side to be provided with a light emitting element (see FIG. 6(f)). The inclination angles of a magnetic-head-side end surface and a light-emitting-element-side end surface were each 45°.

Thereafter, on the rear end side of the wiring portion of the suspension board with circuit, a light emitting element was disposed on the insulating cover layer (see FIGS. 1 and 2).

Example 2

Configuration in which Optical Waveguide is Contained in Base Trench Portion

A suspension board with circuit was produced in the same manner as in EXAMPLE 1 except that the thickness of the insulating base layer was set to 20 μm, the width of the board trench portion was set to 100 μm, a base trench portion was further provided in the insulating base layer, and the optical waveguide was disposed in the base trench portion (see FIG. 7).

That is, when the magnetic-head-side opening and the light-emitting-element-side opening were formed, the metal supporting board was masked so as to be provided with the base trench portion, and the insulating base layer was etched by the same method as used in the plasma etching in EXAMPLE 1. In this manner, the base trench portion was provided in the insulating base layer to couple the magnetic-head-side opening to the light-emitting-element-side opening along the longitudinal direction of the insulating base layer. The width of the base trench portion was 80 μm, and the length thereof was 20 mm.

Then, in the same manner as in EXAMPLE 1, the optical waveguide was formed and stripped from the supporting plate, and an adhesive was coated on the upper and both side surfaces of the optical waveguide.

Then, the upper surface of the optical waveguide was adhered to the bottom surface of the insulating cover layer exposed in the base trench portion, and the both side surfaces of the optical waveguide were adhered to the both inner side surfaces of the base trench portion in the insulating base layer to place the optical waveguide in the base trench portion.

Then, in the magnetic-head-side opening and the light-emitting-element-side opening, the front and rear end portions of the optical waveguide were simultaneously cut in a direction crossing the longitudinal direction by laser processing from the side to be provided with the magnetic head and from the side to be provided with the light emitting element. The inclination angles of the magnetic-head-side end surface and the light-emitting-element-side end surface were each 45°.

Thereafter, on the rear end side of the wiring portion of the suspension board with circuit, the light emitting element was disposed on the insulating cover layer.

Example 3

Configuration in which Optical Waveguide is Contained in Base Trench Portion, and Supporting Plate was Fitted in Metal Supporting Board A suspension board with circuit was produced in the same manner as in Example 2 except that, after the optical waveguide was formed, it was not stripped from the supporting plate, the supporting plate was processed to have a width of 80 μm, and the optical waveguide was placed in the base trench portion, while the supporting plate was fitted into the metal supporting board (see FIG. 8).

That is, after the optical waveguide was formed in the same manner as in Example 2, it was not stripped from the supporting plate, and an adhesive was coated on the upper and both side surfaces of the optical waveguide. The adhesive was further coated on the both side surfaces of the supporting plate.

Then, the upper surface of the optical waveguide was adhered to the bottom surface of the insulating cover layer which was exposed in the base trench portion, and the both side surfaces of the optical waveguide were adhered to the both inner side surfaces of the base trench portion in the insulating base layer to place the optical waveguide in the base trench portion, while the both side surfaces of the supporting plate were adhered to the both inner side surfaces of the board trench portion in the metal supporting board to fit the supporting plate into the board trench portion.

Then, in the magnetic-head-side opening and the light-emitting-element-side opening, the front and rear end portions of the optical waveguide were simultaneously cut in a direction crossing the longitudinal direction by laser processing from the side to be provided with the magnetic head and from the side to be provided with the light emitting element. The inclination angles of the magnetic-head-side end surface and the light-emitting-element-side end surface were each 45°.

Thereafter, on the rear end side of the wiring portion of the suspension board with circuit, a light emitting element was disposed on the insulating cover layer.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A suspension board with circuit comprising:
   a metal supporting board including a board trench portion;
   an insulating base layer formed on a surface of the metal supporting board;
   a conductive pattern formed on a surface of the insulating base layer; and
   an optical waveguide provided to overlap the board trench portion when projected in a thickness direction of the metal supporting board,
   wherein at least a part of the optical waveguide is positioned closer to the conductive pattern than to a back surface of the metal supporting board,
   a magnetic-head-side opening is formed on a head-slider mounting portion for mounting a head slider provided with a magnetic head,
   the magnetic-head-side opening extending through the metal supporting board and the insulating base layer in the thickness direction thereof,
   a light-emitting-element-side opening is formed on a light-emitting-element mounting portion for mounting a light emitting element,
   the light-emitting-element-side opening extending through the metal supporting board and the insulating base layer in the thickness direction thereof,
   the board trench portion and the optical waveguide are continuously provided between the magnetic-head-side opening and the light-emitting-element-side opening,
   a magnetic-head-side end surface as a front end surface of the optical waveguide is disposed so as to face the magnetic-head-side opening, while a light-emitting-element-side end surface as a rear end surface thereof is disposed so as to face the light-emitting-element-side opening,
   the light-emitting-element-side end surface is formed as an inclined surface that crosses the longitudinal direction of the optical waveguide at a predetermined angle,
   the magnetic-head-side end surface is formed as an inclined surface that crosses the longitudinal direction of the optical waveguide at a predetermined angle, and
   light emitted from the light emitting element passes through the light-emitting-element-side opening to have an optical path thereof changed at a predetermined angle by the light-emitting-element-side end surface and is then incident on the optical waveguide, and light emitted from the optical waveguide has an optical path thereof changed at a predetermined angle by the magnetic-head-side end surface and is then emitted toward the magnetic-head-side opening.

2. The suspension board with circuit according to claim 1, wherein the optical waveguide is contained in the board trench portion.

3. The suspension board with circuit according to claim 1, wherein a base trench portion is provided in the insulating base layer so as to overlap the board trench portion when projected in the thickness direction of the metal supporting board, and the optical waveguide is contained in the base trench portion.

4. The suspension board with circuit according to claim 3, wherein
   a supporting plate is provided on a lower surface of the optical waveguide, at least a part of the optical waveguide is contained in the base trench portion, and at least a part of the supporting plate is fitted in the board trench portion.

5. The suspension board with circuit according to claim 1, wherein the board trench portion is generally rectangular in cross-section.

* * * * *